(12) United States Patent
Arai et al.

(10) Patent No.: US 6,927,416 B2
(45) Date of Patent: Aug. 9, 2005

(54) WAFER SUPPORT PLATE

(75) Inventors: Kazuhisa Arai, Tokyo (JP); Masatoshi Nanjo, Tokyo (JP); Masahiko Kitamura, Tokyo (JP); Shinichi Namioka, Tokyo (JP); Koichi Yajima, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 10/736,685

(22) Filed: Dec. 17, 2003

(65) Prior Publication Data

US 2004/0124413 A1 Jul. 1, 2004

(30) Foreign Application Priority Data

Dec. 26, 2002 (JP) ........................................ 2002-377077

(51) Int. Cl.⁷ .......................... H01L 23/58; H01L 29/04
(52) U.S. Cl. ......................................... 257/48; 257/627
(58) Field of Search ........................... 257/48, 627, 628

(56) References Cited

U.S. PATENT DOCUMENTS

2003/0094674 A1 * 5/2003 Ipposhi et al. .............. 257/627

FOREIGN PATENT DOCUMENTS

JP          7-014912          1/1995
JP          2001-267193       9/2001

OTHER PUBLICATIONS

"Semiconductor devices–Physics and technology" by Sze, 1985, pp. 328–329.*

* cited by examiner

Primary Examiner—Steven Loke
(74) Attorney, Agent, or Firm—Wenderoth, Lind & Ponack, L.L.P.

(57) ABSTRACT

A wafer support plate comprises a support surface on which a semiconductor wafer is supported, and a crystal orientation mark which indicates the crystal orientation of the semiconductor wafer. Even the semiconductor wafer thinned by grinding can be stably held on the support surface, and the crystal orientation can be recognized even when the outer periphery of the semiconductor wafer has chipped.

16 Claims, 3 Drawing Sheets

WAFER SUPPORT PLATE

BACKGROUND OF THE INVENTION

1. Field of the Invention

The present invention relates to a wafer support plate which supports a thinned semiconductor wafer, and with which the crystal orientation of the semiconductor wafer can be recognized.

2. Related Art

A semiconductor wafer is worked via many processes. A cut-away portion called a "notch" is sometimes formed in the outer periphery of the semiconductor wafer in order that the crystal orientation of this semiconductor wafer may be realizable in the course of the working as seen in JP-A-7-014912 (FIG. 4).

However, when the outer periphery of the semiconductor wafer has chipped on account of grinding, there is the problem that the notch becomes indistinguishable from the chipping and the crystal orientation becomes unrecognizable as the result. Therefore, it has also been proposed that, besides the notch, a mark for recognizing the crystal orientation be formed in the semiconductor wafer as seen in JP-A-2001-267193.

In recent years, however, semiconductor wafers have needed to be ground as thin as below 100 μm or even below 50 μm for the purpose of reducing the sizes and lightening the weights of various electronic equipment. When the semiconductor wafer is ground so thin, chipping appears in the outer periphery of the semiconductor wafer and is indistinguishable from a notch formed in this semiconductor wafer, resulting in the problem that the treatment of the ground semiconductor wafer becomes complicated. Another problem is that the rigidity of the semiconductor wafer lowers drastically, so the handling thereof becomes difficult.

Especially with a technique called "pre-dicing" wherein dicing grooves whose depth corresponds to the thickness of semiconductor chips are formed in the front surface of the semiconductor wafer beforehand, and wherein the rear surface of the semiconductor wafer is ground until the dicing grooves appear from the side of the rear surface, to thereby divide the semiconductor wafer into the individual semiconductor chips, the rigidity is lost by the division of the semiconductor wafer into the individual pieces, and the handling of this semiconductor wafer becomes very difficult. Moreover, innumerable pieces of chipping appear in the outer periphery of the divided semiconductor wafer, the crystal orientation of the semiconductor wafer becomes quite unrecognizable, and the subsequent treatment becomes more complicated.

SUMMARY OF THE INVENTION

An object of the present invention is to facilitate the handling of a thinned semiconductor wafer, and to make the crystal orientation of the semiconductor wafer recognizable at all times.

As practicable means for accomplishing the object, the present invention provides a wafer support plate comprising a support surface on which a semiconductor wafer is supported; and a crystal orientation mark which indicates a crystal orientation of the supported semiconductor wafer.

The crystal orientation mark may be formed at an outer-peripheral part of the support surface. Also, the crystal orientation mark may be formed on an outer-peripheral side surface of the support surface. Further, the crystal orientation mark may be formed by cutting away an outer-peripheral part of the support surface. Furthermore, the wafer support plate may be formed of a material selected from the group consisting of glass, metal, ceramics, and synthetic resin.

According to the wafer support plate constructed as described above, even a thinned semiconductor wafer can be stably supported, and since the crystal orientation mark is formed, even a semiconductor wafer whose rigidity has drastically lowered can be easily handled, and the crystal orientation can be always recognized even when the outer periphery of a semiconductor wafer has chipped on account of grinding.

Especially in pre-dicing, the wafer support plate is very useful for the reason that, even when innumerable pieces of chipping have appeared in the outer periphery of a semiconductor wafer divided into individual semiconductor chips, the semiconductor wafer whose rigidity has been lost can be held supported, while the crystal orientation of the semiconductor wafer can be always recognized.

DETAILED DESCRIPTION OF PREFERRED EMBODIMENTS

Figure 1:
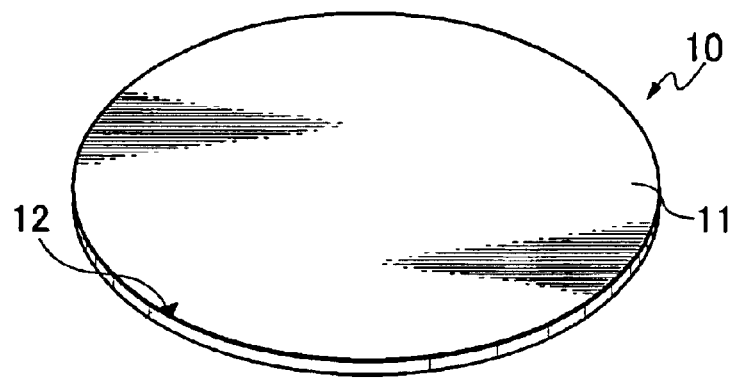
FIG. 1 is a perspective view showing a first embodiment of a wafer support late according to the present invention.

Embodiments of the present invention will be described with reference to the drawings. A wafer support plate 10 shown in FIG. 1 illustrates the first embodiment of the present invention. The front surface of a substrate formed to be circular is a support surface 11 for supporting a semiconductor wafer, and a crystal orientation mark 12 is formed at the outer peripheral part. The wafer support plate 10 is formed of a material of high rigidity, such as glass, metal, ceramics or synthetic resin, and it can stably support even a very thin semiconductor wafer whose thickness is, for example, 100 μm or less. Incidentally, although not shown, a crystal orientation mark can also be formed on the rear surface of a support surface. In this case, a wafer support plate can be made the same size as that of the semiconductor wafer.

Figure 2:
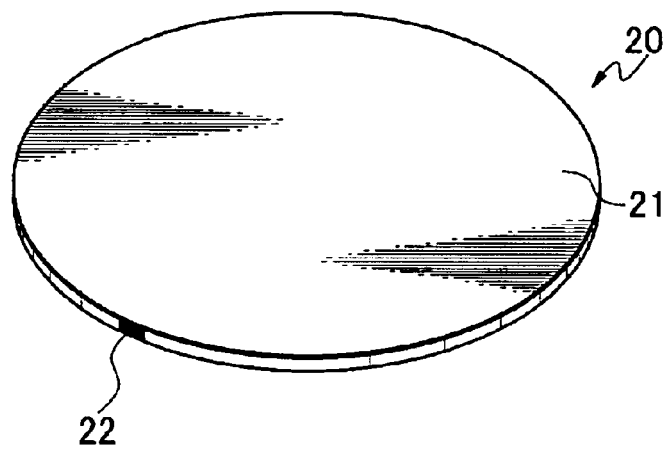
FIG. 2 is a perspective view showing a second embodiment of a wafer support plate according to the present invention.

A wafer support plate 20 shown in FIG. 2 illustrates the second embodiment of the present invention. The front surface of a substrate formed to be circular is a support surface 21 for supporting a semiconductor wafer, and a crystal orientation mark 22 is formed at the outer-peripheral side surface. The wafer support plate 20 is also formed of a material of high rigidity, such as glass, metal, ceramics or synthetic resin, and it can stably support even a very thin semiconductor wafer whose thickness is, for example, 100 μm or less. Also in this case, the wafer support plate 20 can be made the same size as that of the semiconductor wafer.

Figure 3:
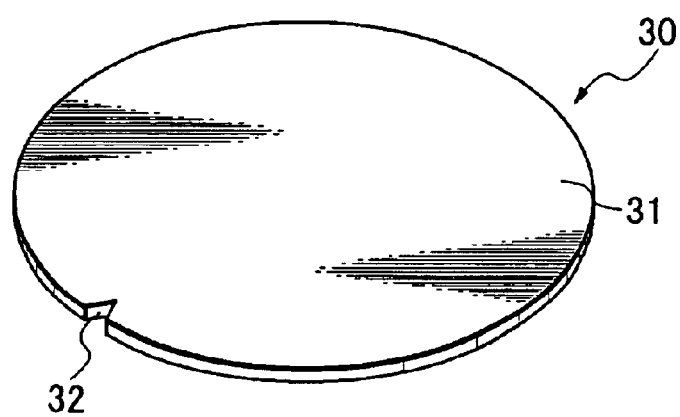
FIG. 3 is a perspective view showing a third embodiment of a wafer support plate according to the present invention.

A wafer support plate 30 shown in FIG. 3 illustrates the third embodiment of the present invention. The front surface of a substrate formed to be circular is a support surface 31 for supporting a semiconductor wafer, and the outer peripheral part of which is notched so as to form a crystal orientation mark 32. The wafer support plate 30 is also formed of a material of high rigidity, such as glass, metal, ceramics or synthetic resin, and it can stably support even a very thin semiconductor wafer whose thickness is, for example, 100 μm or less.

By the way, in any of FIGS. 1, 2 and 3, the wafer support plate should preferably be made 0.5 mm –1.5 mm thick when formed of the glass or ceramics; it should preferably be made 0.3 mm –1.0 mm when formed of the metal (for example, stainless steel); and it should preferably be made 0.1 mm –0.5 mm when formed of the synthetic resin (for example, PET).

Figure 4:
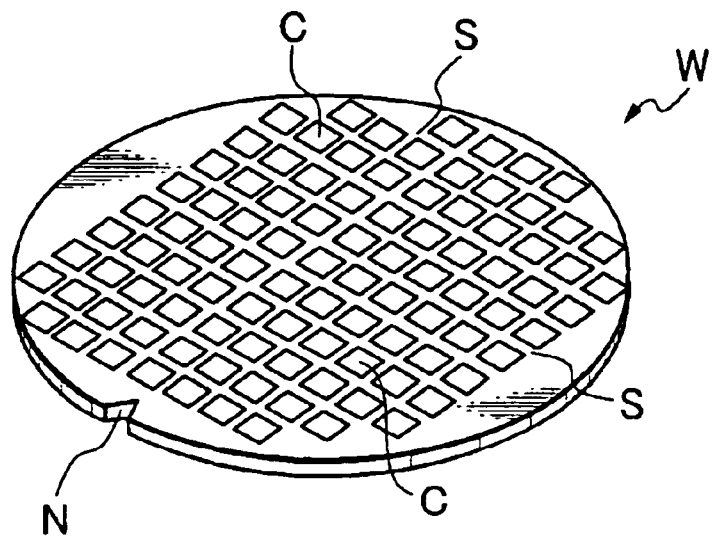
FIG. 4 is a perspective view showing an example of a semiconductor wafer.

In the ensuing description, there will be exemplified a case where the rear surface of the semiconductor wafer is ground using the wafer support plate 10 shown in FIG. 1. As shown in FIG. 4, the front surface of the semiconductor wafer W is formed with a plurality of circuits which are partitioned by streets S, and the semiconductor wafer W is divided along the streets S into individual semiconductor chips C. A notch N is formed in the outer periphery of the semiconductor wafer W.

Figure 5:
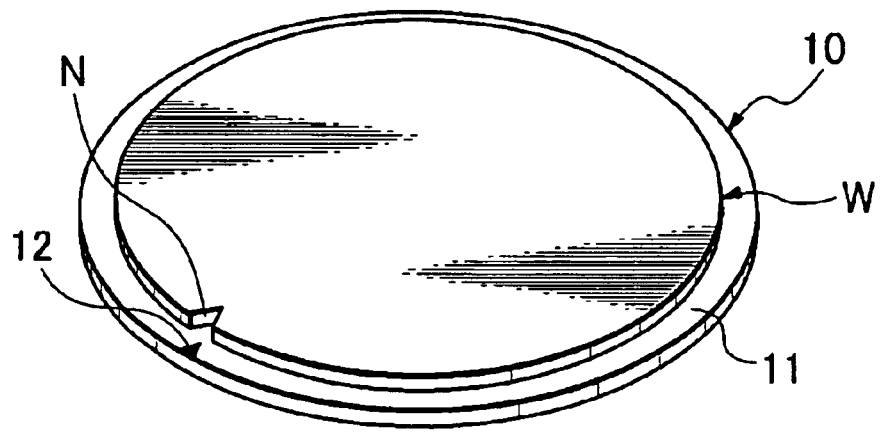
FIG. 5 is a perspective view showing a state where the semiconductor wafer is supported on a wafer support plate.

The semiconductor wafer W shown in FIG. 4 is turned over, and the front surface of the semiconductor wafer W is fixed onto the support surface 11 of the wafer support plate 10 by adhesion or the like as shown in FIG. 5. On this occasion, the position of the notch N formed in the semiconductor wafer W is aligned with that of the crystal orientation mark 12 formed on the wafer support plate 10.

Figure 6:
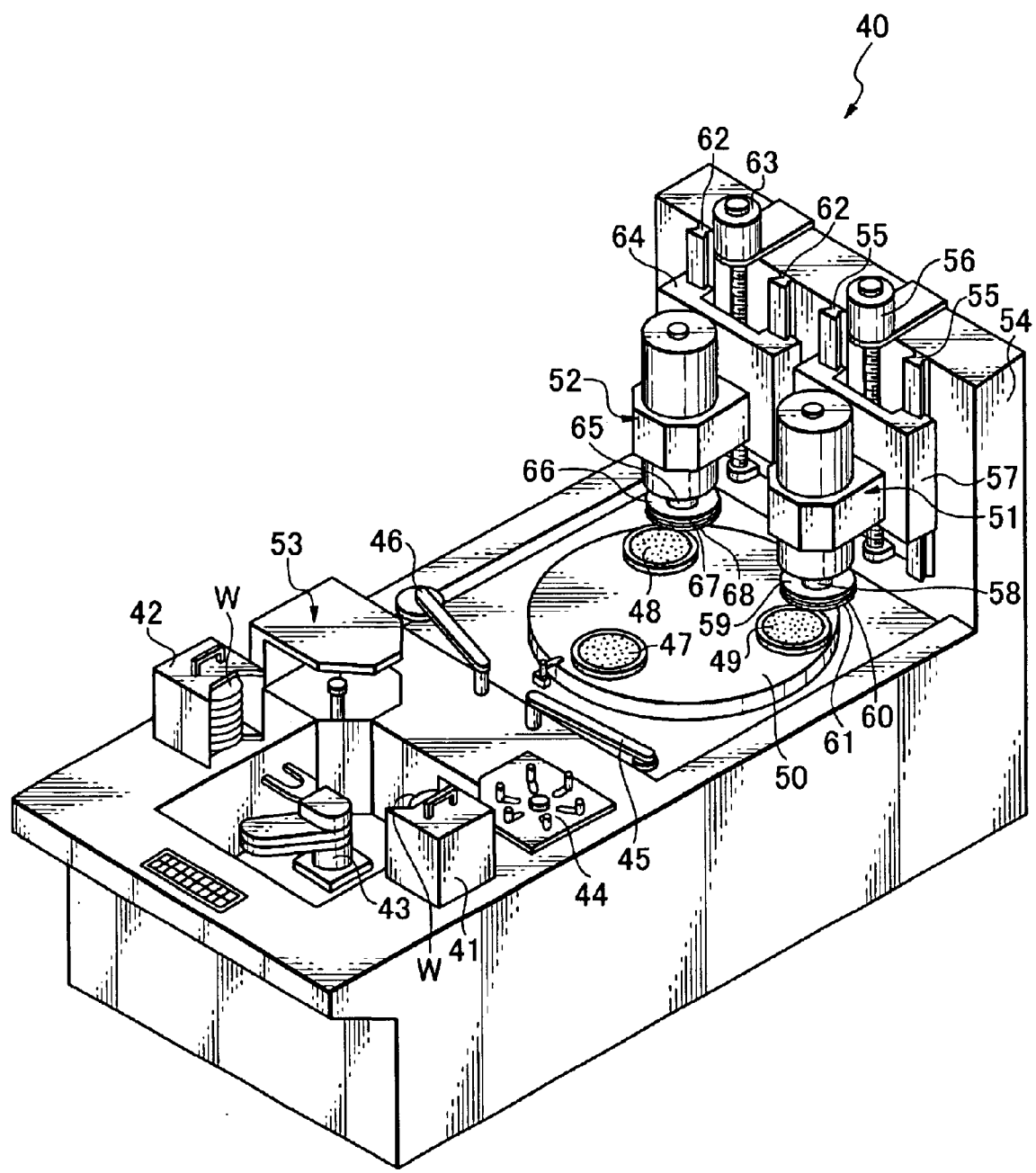
FIG. 6 is a perspective view showing an example of a grinding apparatus.

The semiconductor wafer W thus made integral with the wafer support plate 10 has its rear surface ground into a desired thickness by a grinding apparatus 40 shown in FIG. 6 by way of example.

The grinding apparatus 40 shown in FIG. 6 includes cassettes 41, 42 which accommodate semiconductor wafers W therein, delivery means 43 for carrying the semiconductor wafer W out of the cassette 41 or carrying the semiconductor wafer W into the cassette 42, a centering table 44 for positioning the center of the semiconductor wafer W, first conveyance means 45 and second conveyance means 46 for conveying the semiconductor wafer W, three chuck tables 47, 48, 49 for holding the semiconductor wafers W by suction, respectively, a turntable 50 which rotatably supports the chuck tables 47, 48, 49, first grinding means 51 and second grinding means 52 for grinding the semiconductor wafers W, respectively, and cleansing means 53 for cleansing the ground semiconductor wafer W.

The semiconductor wafers W before being ground, in a state where they are respectively supported on wafer support plates 10, are stacked in a plurality of stages and accommodated in the cassette 41. They are picked up one by one by the delivery means 43 so as to be placed on the centering table 44.

Besides, the center of the semiconductor wafer W is positioned in the centering table 44. Thereafter, the semiconductor wafer W is drawn by suction by the first conveyance means 45 and is conveyed onto the chuck table 47 by the swiveling motion thereof, whereby the semiconductor wafer W supported on the wafer support plate 10 is placed on the chuck table 47. On this occasion, the semiconductor wafer W is in a state where its rear surface faces upwards.

Subsequently, the turntable 50 is rotated by a required angle (120 degrees in the case where the number of the chuck tables is three as in the illustrated example), whereby the semiconductor wafer W is located underneath the first grinding means 51. Incidentally, on this occasion, the chuck table 48 is automatically located at a position at which the chuck table 47 lay before the rotation of the turntable 50. In this state, the semiconductor wafer W to be subsequently ground is carried out of the cassette 41 and is placed on the centering table 44, and after having its center positioned, the semiconductor wafer W is conveyed to and placed on the chuck table 48 by the first conveyance means 45.

The first grinding means 51 is movable up and down along an erect wall portion 54. More specifically, a pair of rails 55 are juxtaposed in a vertical direction on the inner side surface of the wall portion 54, and a supporter 57 is driven by a drive source 56 so as to move up or down along the rails 55. With the upward or downward movement of the supporter 57, the first grinding means 51 fixed to this supporter 57 is moved up or down.

In the first grinding means 51, a grinding wheel 60 is mounted through a mounter 59 on the distal end of a spindle 58 rotatably supported, and a grindstone 61 for rough grinding is secured to the lower part of the grinding wheel 60.

When the semiconductor wafer W supported on the wafer support plate 10 has been located underneath the first grinding means 51, the first grinding means 51 descends while the semiconductor wafer W is kept rotating by the rotation of the chuck table 47, and also, the grindstone 61 is kept rotating by the rotation of the spindle 58. Thus, the rotating grindstone 61 comes into contact with the rear surface of the semiconductor wafer W, and the rear surface of the semiconductor wafer W is roughly ground. Here, in case of so-called "pre-dicing", the grinding is ended immediately before dicing grooves appear on the rear surface.

The semiconductor wafer W which is integral with the wafer support plate roughly ground, is located underneath the second grinding means 52 in such a way that the turntable 50 is further rotated by the required angle.

The second grinding means 52 is movable up and down along the erect wall portion 54. More specifically, a pair of rails 62 are juxtaposed in the vertical direction on the inner side surface of the wall portion 54, and a supporter 64 is driven by a drive source 63 so as to move up or down along the rails 62. With the upward or downward movement of the supporter 64, the second grinding means 52 fixed to this supporter 64 is moved up or down.

In the second grinding means 52, a grinding wheel 67 is mounted through a mounter 66 on the distal end of a spindle 65 rotatably supported, and a grindstone 68 for finish grinding is secured to the lower part of the grinding wheel 67.

When the semiconductor wafer W integral with the wafer support plate 10 and subjected to the rough grinding has been located underneath the second grinding means 52, the second grinding means 52 descends while the semiconductor wafer W is kept rotating by the rotation of the chuck table 47, and also, the grindstone 68 is kept rotating by the rotation of the spindle 65. Thus, the rotating grindstone 68 comes into contact with the rear surface of the semiconductor wafer W, and the rear surface of the semiconductor wafer W is ground and smoothened. Here, in the case of the so-called "pre-dicing", the dicing grooves appear to divide the semiconductor wafer W into individual semiconductor chips.

The semiconductor wafer W held on the chuck table 47 and subjected to the finish grinding is returned to its first position by the rotation of the turntable 50. Besides, the semiconductor wafer W is conveyed into the cleansing means 53 by the second conveyance means 46 and is cleansed therein. Thereafter, the semiconductor wafer W is accommodated into the cassette 42 by the delivery means 43 in a state where it is held supported on the wafer support plate 10.

Since each semiconductor wafer W is rotated by the rotation of the chuck table during the rough grinding and the finish grinding, the individual semiconductor wafers are accommodated into the cassette 42 in a state where their crystal orientations are not in alignment. Herein, however, each wafer support plate 10 is formed with the crystal orientation mark 12. Therefore, even when the outer periphery of the semiconductor wafer W has chipped to make the notch N of this semiconductor wafer indistinguishable, the crystal orientation of the semiconductor wafer W can be always recognized at manufacturing steps after the grinding treatment, by detecting the crystal orientation mark 12 formed on the wafer support plate 10.

Moreover, since the semiconductor wafer is held supported on the wafer support plate, such handling is facilitated as the conveyance of the semiconductor wafer which has been thinned to drastically lower in rigidity, or the semiconductor wafer which has lost its rigidity on account of the division into the individual semiconductor chips by the so-called "pre-dicing".

As thus far described, a wafer support plate according to the present invention can stably support even a thinned semiconductor wafer, and it is formed with a crystal orientation mark. Therefore, even a semiconductor wafer whose rigidity has drastically lowered can be easily handled, and the crystal orientation of a semiconductor wafer can be always recognized even when the outer periphery thereof has chipped on account of grinding.

Especially in pre-dicing, the wafer support plate is very useful for the reason that, even when innumerable pieces of chipping have appeared in the outer periphery of a semiconductor wafer divided into individual semiconductor chips, the semiconductor wafer whose rigidity has been lost can be held supported, while the crystal orientation of the semiconductor wafer can be always recognized.

What is claimed is:

1. A wafer support plate for supporting a semiconductor wafer, comprising:
    a support surface on which the semiconductor wafer is to be supported; and
    a crystal orientation mark which indicates a crystal orientation of the supported semiconductor wafer.
2. A wafer support plate according to claim 1, wherein said crystal orientation mark is formed at an outer-peripheral part of said support surface.
3. A wafer support plate according to claim 2, wherein said wafer support plate is formed of a material selected from the group consisting of glass, metal, ceramics, and synthetic resin.
4. A wafer support plate according to claim 1, wherein said crystal orientation mark is formed on an outer-peripheral side surface of said support surface.
5. A wafer support plate according to claim 4, wherein said wafer support plate is formed of a material selected from the group consisting of glass, metal, ceramics, and synthetic resin.
6. A wafer support plate according to claim 1, wherein said crystal orientation mark is formed as a cut-out notch of an outer-peripheral part of said support surface.
7. A wafer support plate according to claim 4, wherein said wafer support plate is formed of a material selected from the group consisting of glass, metal, ceramics, and synthetic resin.
8. A wafer support plate according to claim 1, wherein said wafer support plate is formed of a material selected from the group consisting of glass, metal, ceramics, and synthetic resin.
9. A semiconductor wafer arrangement including:
    a semiconductor wafer; and
    a wafer support plate comprising
    a support surface on which said semiconductor wafer is supported; and
    a crystal orientation mark which indicates a crystal orientation of said supported semiconductor wafer.
10. A semiconductor wafer arrangement according to claim 9, wherein said crystal orientation mark is formed at an outer-peripheral part of said support surface.
11. A semiconductor wafer arrangement according to claim 10, wherein said wafer support plate is formed of a material selected from the group consisting of glass, metal, ceramics, and synthetic resin.
12. A semiconductor wafer arrangement according to claim 9, wherein said crystal orientation mark is formed on an outer-peripheral side surface of said support surface.
13. A semiconductor wafer arrangement according to claim 12, wherein said wafer support plate is formed of a material selected from the group consisting of glass, metal, ceramics, and synthetic resin.
14. A semiconductor wafer arrangement according to claim 9, wherein said crystal orientation mark is formed as a cut-out notch of an outer-peripheral part of said support surface.
15. A semiconductor wafer arrangement according to claim 14, wherein said wafer support plate is formed of a material selected from the group consisting of glass, metal, ceramics, and synthetic resin.
16. A semiconductor wafer arrangement according to claim 9, wherein said wafer support plate is formed of a material selected from the group consisting of glass, metal, ceramics, and synthetic resin.

* * * * *